United States Patent
Taniguchi et al.

(10) Patent No.: US 6,635,925 B1
(45) Date of Patent: Oct. 21, 2003

(54) SEMICONDUCTOR DEVICE AND METHOD OF MANUFACTURING THE SAME

(75) Inventors: Toshimitsu Taniguchi, Gunma (JP); Takashi Arai, Tochigi (JP); Masashige Aoyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/652,891

(22) Filed: Aug. 31, 2000

(30) Foreign Application Priority Data

Oct. 29, 1999 (JP) .......................... P. 11-309365

(51) Int. Cl.⁷ .................. H01L 29/76; H01L 29/94; H01L 31/062; H01L 31/113
(52) U.S. Cl. .................. 257/335; 257/342; 257/343; 257/345; 257/328; 257/336
(58) Field of Search .................. 257/342, 343, 257/345, 328, 336, 335; 438/282

(56) References Cited

U.S. PATENT DOCUMENTS

| | | | | |
|---|---|---|---|---|
| 4,597,824 A | * | 7/1986 | Shinada et al. ............. | 156/643 |
| 5,449,937 A | * | 9/1995 | Arimura et al. ............. | 257/345 |
| 5,536,957 A | * | 7/1996 | Okumura ..................... | 257/336 |
| 6,147,383 A | * | 11/2000 | Kuroda ........................ | 257/344 |
| 6,242,787 B1 | * | 6/2001 | Nakayama et al. ......... | 257/493 |

FOREIGN PATENT DOCUMENTS

JP        405251697 A    *    9/1993

* cited by examiner

*Primary Examiner*—Eddie Lee
*Assistant Examiner*—Joseph Nguyen
(74) *Attorney, Agent, or Firm*—Fish & Richardson P.C.

(57) ABSTRACT

A P-channel type DMOS transistor includes heavily doped source/drain layers 12 formed in an N-type well 2, a gate electrode 18 formed on a channel layer located between the source/drain layers 12, an N-type body layer 14 formed in the vicinity of the source layer, and a lightly-doped drain layer 6 formed between the channel layer and the drain layer 12. In such a P-channel type DMOS transistor, a P-type layer 16 is formed in the channel layer at the upper part of the N-type body layer 14. In this configuration, the driving capability of the P-channel type DMOS transistor can be improved.

8 Claims, 4 Drawing Sheets

– PRIOR ART –

SEMICONDUCTOR DEVICE AND METHOD OF MANUFACTURING THE SAME

BACKGROUND OF THE INVENTION

1. FIELD OF THE INVENTION

The present invention relates to a semiconductor device and a method of manufacturing it, and more particularly to a technique of an LD (Lateral Double diffused) MOS transistor structure serving as a high withstand voltage element that is applied to e.g. an IC for driving liquid-crystal.

2. DESCRIPTION OF THE RELATED ART

Now referring to the drawings, an explanation will be given of a conventional semiconductor device and a method of manufacturing it. The above DMOS transistor structure refers to an element in which impurities of a different conduction type are diffused into a diffused layer previously formed on the surface side of a semiconductor substrate to form new diffused layers and a difference of diffusion in the lateral direction between the diffused layers is used as an effective channel length. A channel length can be shortened and hence is suited to realize a low ON-resistance.

FIG. 6 is a sectional view for explaining a conventional DMOS transistor illustrated in an N-channel type DMOS transistor structure. Although no explanation will be given of a P-channel type DMOS transistor structure, as well known, it can have the same structure as the N-channel type DMOS transistor structure.

In FIG. 6, reference numeral 51 denotes a semiconductor substrate of first conduction type, e.g. P-type. Reference numeral 52 denotes an N-type well within which a P-type body layer 53 is formed. An N-type diffused layer 54 is formed within the P-type body layer 53. An N-type diffused layer 55 is formed within the,N-type well 52. A gate electrode 57 is formed on a substrate surface through a gate oxide film 56. A channel layer 58 is formed in the surface layer of the P-type body layer 53 immediately below the gate electrode 57.

The N-type diffused layer 54 serves as a source diffused layer, the N-type diffused layer 55 serves as a drain diffused layer and the N-type well 52 below a LOCOS oxide film 59 serves as a drift layer. Reference numerals 60 and 61 denote-a source. electrode and a drain electrode, respectively. Reference numeral 62 denotes a P-type diffused layer for taking the potential of the P-type body layer 53. Reference numeral 63 denotes an interlayer insulating film.

An explanation will be given of a method of manufacturing the above DMOS transistor structure. N-type impurities are ion-implanted into the semiconductor substrate 51 to form the N-type well 52. After the gate oxide film 56 has been formed on the substrate 51, the gate electrode 57 is formed through the gate oxide film 56. Using the gate electrode 57 as a mask, the P-type impurities are ion-implanted and diffused to form the P-type body layer 53. Thereafter, the N-type diffused layers 54 and 55 are formed.

In the DMOS transistor described above, since the N-type well 52 is formed by diffusion, the dopant concentration on the surface of the N-type well 52 becomes high, thereby facilitating a current flow on the surface of the N-type well 52 and realizing high withstand voltage. The DMOS transistor having the structure described above is referred to as a relaxing-surface type (Reduced SURface Field: RESURF) DMOS in which the dopant concentration of the drift layer of the N-type-well 2 is set so as to satisfy the RESURF requirement. Such technology is disclosed in JP-A-9-139438.

The above DMOS transistor -structure presents a problem when the P-channel type DMOS transistor is structured.

Specifically, the conductive film constituting a gate electrode is often of the N conduction type. In this case, the driving capability of the P-channel type DMOS transistor is inferior to that of the N-channel type DMOS transistor.

In order to obviate such inconvenience, a high voltage must be applied to improve the switching characteristic. This goes against the tendency of realization of low-voltage

SUMMARY OF THE INVENTION

The first object of the present invention is to provide a P-channel type DMOS transistor, especially a P-channel type DMOS transistor with improved driving capability.

The second object of the present invention is to provide a method of manufacturing a DMOS transistor, especially a P-channel type DMOS transistor.

In order to attain the above object, in accordance with the present invention, there is provided a P-channel type DMOS transistor comprising heavily doped source/drain layers formed in an N-type well, a gate electrode formed on a channel layer located between the source/drain layers, an N-type body layer formed in the vicinity of the source layer, and a lightly-doped drain layer formed between the channel layer and the drain layer, wherein a P-type layer is formed in the channel layer at the upper part of the N-type body layer.

Further, there is provided a method of manufacturing a semiconductor device comprising the steps of ion-implanting P-type impurities into an N-type well to form a (first )lightly-doped drain layer (P-layer), ion-implanting P-type impurities into the N-type well to form a SLP (second lightly-doped drain layer shallow low impurity concentration P type) layer so as to be adjacent to the P-type drain layer ion-implanting the P-type impurities into the N-type well to form heavily-doped P-type source/drain layers and thereafter ion-implanting the N-type impurities into the N-type well to form an N-type body layer so as to pass through the SLP layer and to be adjacent to the P-type source layer, ion-implanting the P-type impurities into the N-type well to form a P-type layer in a channel layer formed at the upper part of the body layer; and forming a gate electrode 18 on the N-type well through a gate oxide film As an improved method, there is provided a method of manufacturing a semiconductor device comprising the steps of forming a second lightly-doped drain layer (P-layer) by ion-implanting P-type impurities into an N-type well, after forming a first lightly-doped drain layer (P-layer) 5so as to be adjacent to the P-type drain layer, and then to form simultaneously a P-type layer in a channel layer. And thereafter ion-implanting the N-type impurities into the N-type well to form an N-type body layer so as to pass through the SLP layer and to be adjacent to the P-type source layer. According to the above method, the step of ion-implanting P-type impurities to form the P-type layer in a channel layer can be reduced.

Further in the above DMOS transistor, by forming a impurity region for controlling the driving capability, in each of the channel regions corresponding to each conduction type of transistors, the driving capability of each conduction type of transistors formed in a same substrate can be made substantially equal to each other. The above technology can be applicable to opposite conduction type of transistor or same conduction type of transistor.

In accordance with the invention, by forming the thin P-type impurity layer in the channel layer, the driving capability of the P-channel type DMOS transistor that is inferior to that of the N-channel type DMOS transistor can be improved.

The manufacturing method according to the invention, in which all the impurity layers have been formed before the gate electrode is formed, can provide the P-channel DMOS transistor having the structure described above.

The above and other objects and features of the invention will be more apparent from the following description taken in conjunction with the accompanying drawings.

DESCRIPTION OF THE PREFERRED EMBODIMENTS

Figure 1:
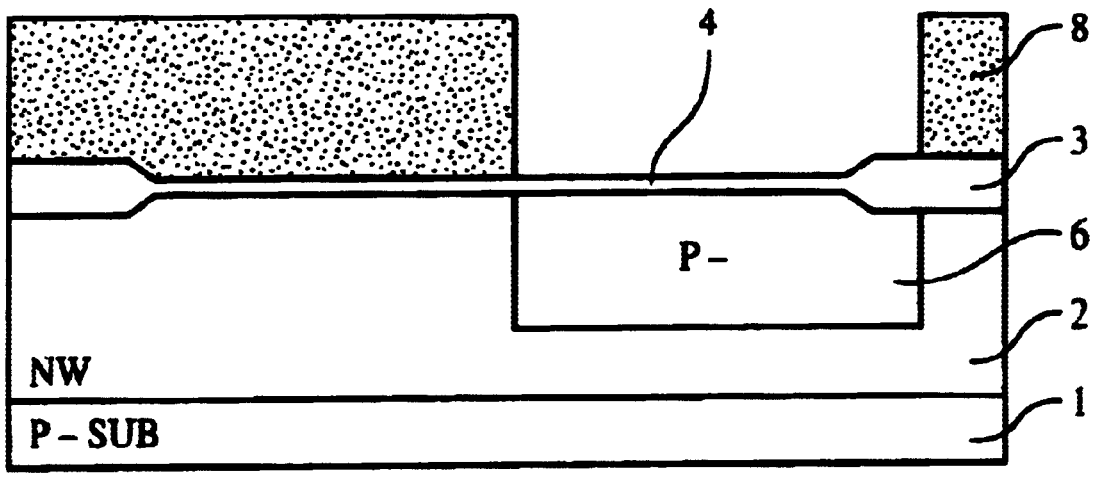
FIGS. 1 to 5 are sectional views showing a method of manufacturing a semiconductor device according to an embodiment of the invention.

Now referring to the drawings, an explanation will be given of an embodiment of a semiconductor device according to the invention and a method of manufacturing it.

Figure 5A:
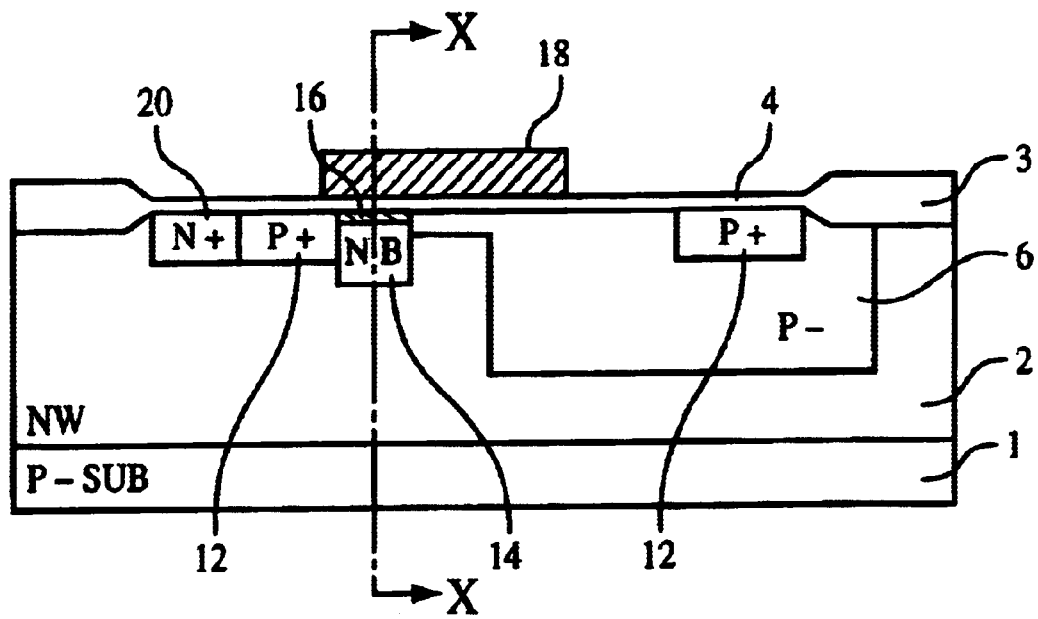
Figure 5B:
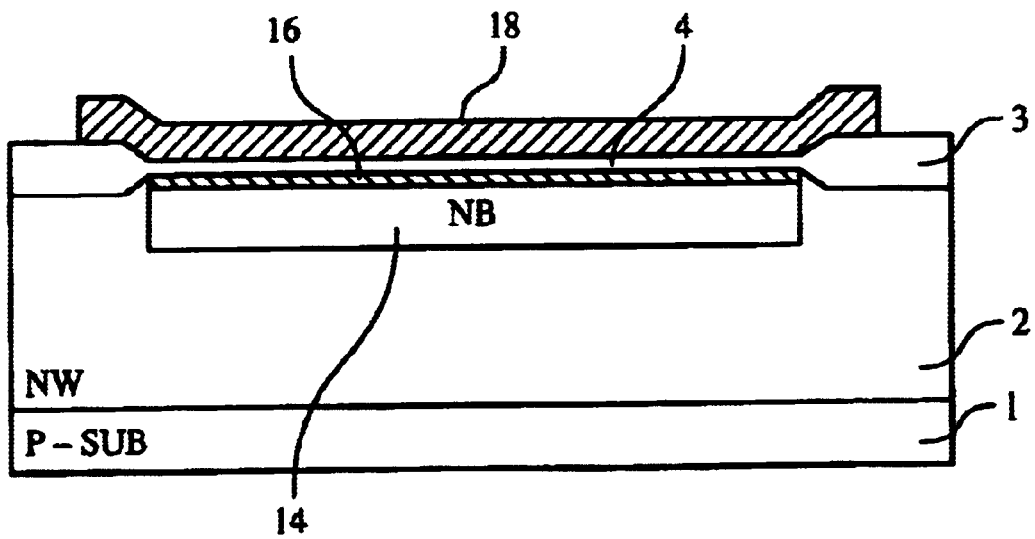
Figure 6:
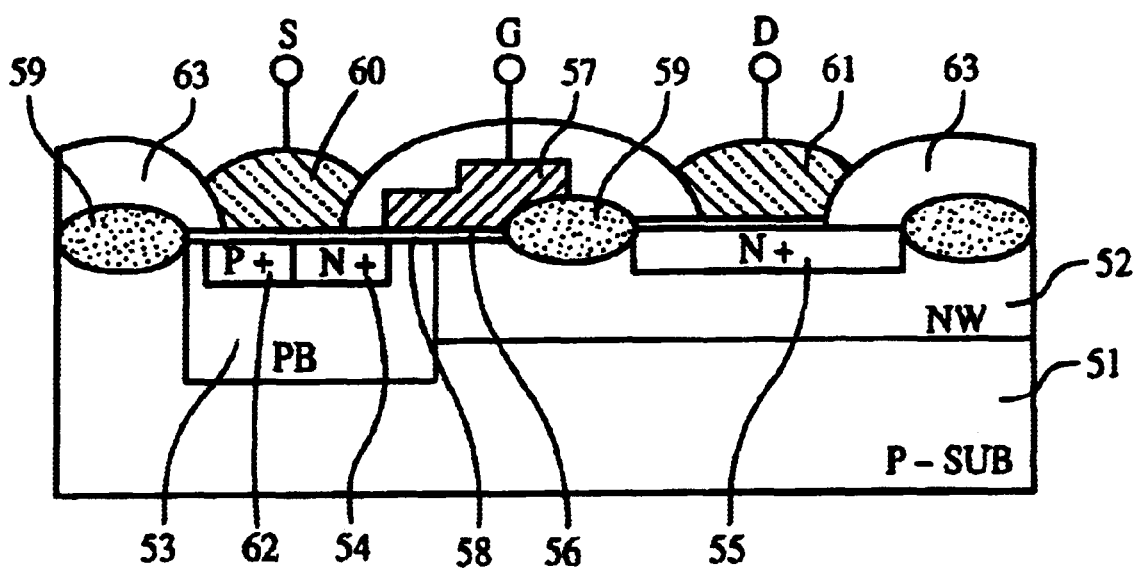
FIG. 6 is a sectional view showing a conventional semiconductor device.

FIGS. 5A and 5B are sectional views showing an LDMOS transistor according to the invention. Now, an explanation will be given of the structure for improving the driving capability of a P-channel type MOS transistor to which the invention is directed. FIGS. 5B is a sectional view of x—x directions of FIG. 5A, it is a sectional view in gate width direction. P type layer 16 is formed on a whole surface of the N type body region.

In FIG. 5, reference numerals 1 and 2 denote e.g. a P-type semiconductor substrate (P-Sub) and an N-type-well (NW), respectively. A P-channel type DMOS transistor is formed on the N-type well 2 defined by an element isolation film 3-formed by the LOCOS technique.

Reference numeral 4 denotes a gate oxide film formed by thermal oxidation. Reference numeral 18 denotes a gate electrode formed thereon. Two reference numerals 12 denote a heavily-doped P+type source layer (P+ layer 12) formed adjacently to the one end of the gate electrode 18 and a heavily-doped P+type drain layer (P+ layer 12) formed at a position apart from the other end of the gate electrode 18. Reference numeral 14 denotes an N-type body layer (NB) formed below the gate electrode 18 on the side of the source layer 12. In a channel layer located at the upper part of the N-type body layer 14, a P-type layer 16 that is a feature of the invention is formed. In an area located between the N-type body layer 14 and the P-type drain layer (P+ layer 12) through the channel layer, a lightly-doped P-type drain layer (P– layer 6) is formed.

As described above, the feature of the invention resides in that in the channel layer at the upper part of the N-type body layer 14 below the gate electrode, the lightly-doped layer 16 for adjusting a threshold value is formed. This improves the driving capability of the P-channel type DMOS transistor which is inferior to that of the N-channel type DMOS transistor in the case that gate electrode is made of n type conduction film.

Further according to the present invention, limitation in circuit design or process can be reduced. The present invention is applicable not only to P type DMOS transistor but also to N type DMOS transistor in order to improve the driving capability. Instead of forming the P type layer 16 in the channel layer in the N type body layer, by forming the N type layer in the channel layer in the P type body layer, improvement of the driving capability can be obtained.

Further the present invention can be applicable not only to one of two conduction type of transistors but also to both of two conduction type of transistors. A plurality of DMOS transistors formed in the same substrate, which are different conduction type of transistors can be also applicable. By controlling each condition for forming impurity regions, the driving capability can be made uniform or controlled appropriately.

The present invention can be applicable to a plurality of same conduction type of transistors which have different gate lengths of same conduction type of transistors. Thereby the driving capability of the transistors can be made uniform or controlled appropriately.

An explanation will be given of a method of manufacturing the P-channel type DMOS transistor.

First, in FIG. 1, in order to define the regions constituting several kinds of MOS transistors, an N-type well 2 is formed within e.g. a P-type semiconductor substrate 1. In order to element-isolate MOS transistors from one another, an element isolation film 3 having a thickness of about 500 nm is formed by the LOCOS technique. On the other active region than the element isolation film 3, a comparatively thick gate oxide film 4 for realizing a high-withstand voltage having a thickness of about 80 nm is formed by thermal oxidation. Using a resist film 5 as a mask, a lightly-doped P-type layer (lightly-doped drain layer, referred to as a P– layer 6) is formed. Specifically, in a state where the other region than the region where the P– layer 6 is to be formed is covered with the resist film 5, for example, boron ions are ion-implanted into the surface layer of the substrate under the implanting condition of $8.5 \times 10^{12}/cm^2$ at an accelerating voltage of about 120 KeV so that the P– layer 6 is formed. Actually, the substrate is subjected to an annealing step (e.g. two hours in an atmosphere of $N_2$ at 1100° C.) that is a post step so that the ion-implanted ions species are thermally diffused to form the P– layer 6.

Figure 2:
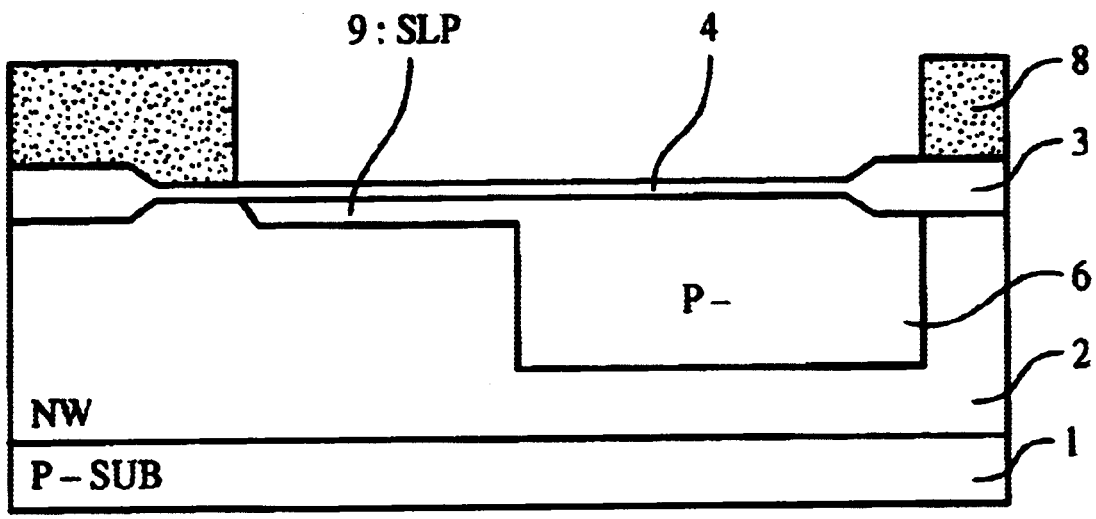

Next, in FIG. 2, using a resist film 8 as a mask a second lightly-doped layer P-type (SLP) layer 9 is formed so as to be adjacent the P– layer 6. Specifically, in a state where the other region than the region where the SLP layer 9 is to be formed is covered with the resist film 8, for example, boron difluoride ions are ion-implanted into the surface layer of the substrate under the implanting condition of $2.5 \times 10^{12} /cm^2$ at an accelerating voltage of about 140 KeV so that the SLP layer 9 successive to the P– layer 6 is formed.

Figure 3:
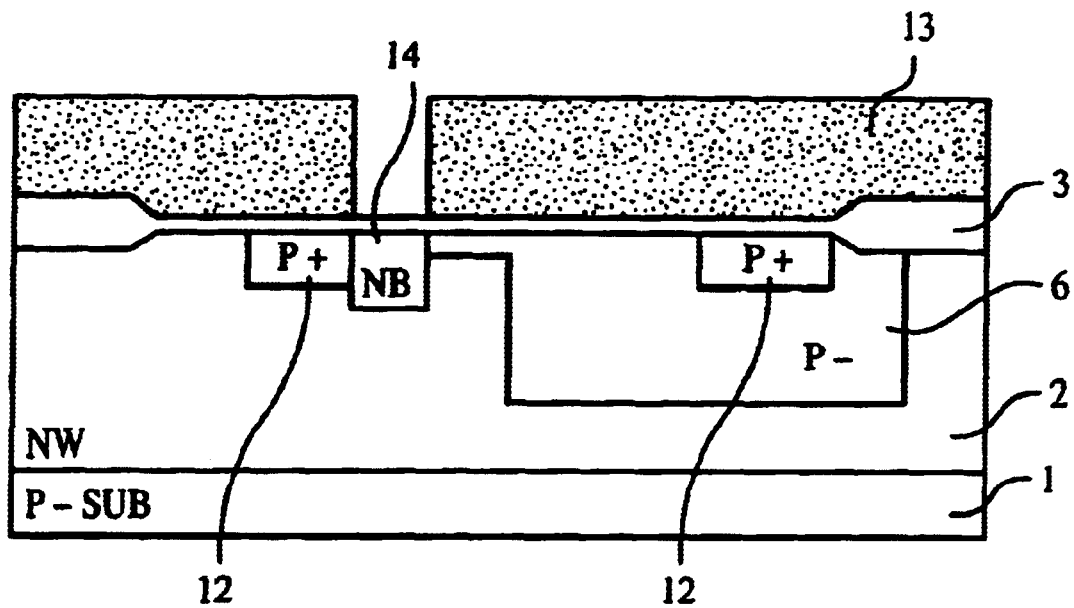

Further, in FIG. 3, using a resist film (not shown) as a mask, heavily-doped P type source/drain layers (hereinafter referred to as P+ layers 12) are formed. Specifically, in a state where the other region than the region where the P+ layers are to be formed is covered with the resist film , for example, boron difluoride ions are ion-implanted into the surface layer of the substrate under the implanting condition of $2 \times 10^{15}/cm^2$ at an accelerating voltage of about 140 KeV so that the P+ layers 12 are formed.

Using a resist film 13 as a mask, N-type impurities are ion-implanted through the SLP layer 9 so that an N-type body (NB) layer 14 is formed so as to be adjacent to the P+ layer 12 on the side of the source layer. Specifically, in a state where the other region than the region where the N-type body layer is to be formed is covered with the resist film 13, for example, phosphorus ions are ion-implanted into the surface layer of the substrate under the implanting condition of $5 \times 10^{12}/cm^2$ at an accelerating voltage of about 190 KeV. so that the N-type body layer 14 is formed. An order of ion injection processes as shown FIGS. 2–4 can be changed.

Figure 4:
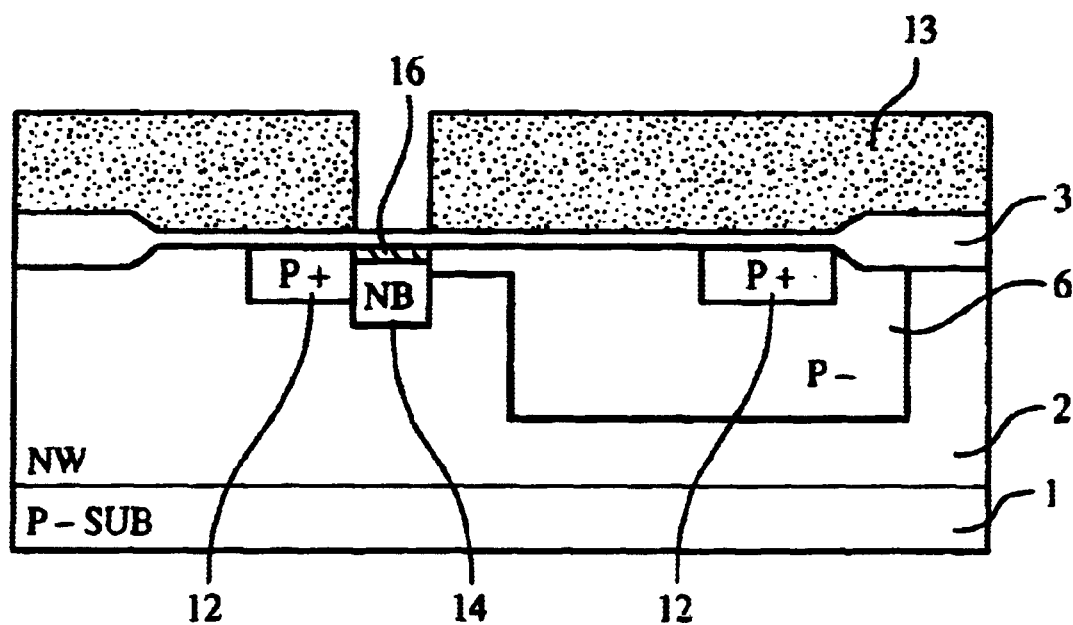

Further, in FIG. 4, using the above resist film 13 as a mask, a lightly-doped P-type layer 16 is formed. Specifically, in a state where the other region-than the region (the above N-type body layer) where the P-type layer is to be formed is covered with the resist film 13, for example, boron difluoride ions are ion-implanted into the surface layer of the substrate under the implanting condition of $3\times10^{12}/cm^2$ at an accelerating voltage of about 120 KeV so that the P type layer 16 is formed. Incidentally, the order of executing the above various steps of ion-implantation as shown in FIGS. 2 to 4 can be changed in case of necessity. Further, in FIG. 5, a polysilicon film having a thickness of about 100 nm is formed on the entire substrate surface. The polysilicon film is subjected to the thermal diffusion from a thermal diffusion source of $POCl_3$ so that it is made conductive to have N-type conductivity. On the polysilicon film, a tungsten silicide (Wsix) film having a thickness of about 100 nm and a $SiO_2$ film having a thickness of 150 nm are stacked successively. Using a resist film (not shown), patterning is done to form the gate electrode for each MOS transistor. Reference numeral 20 denotes an N-type diffused layer for taking the potential of the P-type body layer 14, which is formed at a position adjacent to the above P-type source layer 12. The potential of the P-type body layer 14 is connected with N xtype diffused layer 20 through N-type well.

Although not explained referring to the drawings, after an interlayer insulating film composed of a TEOS film and BPSG film and having a thickness of 600 nm has been formed on the entire substrate surface, a metallic wiring layer in contact with each of the above heavily-doped source/drain layers 12 is formed to complete the P-channel type DMOS transistor. Although have-not been explained, the N-channel type DMOS transistor will be also manufactured through the same process as that of the P-channel type DMOS transistor. In-this case, it is of course that the step corresponding to the step of forming the P-type layer in the interface of the above channel layer is not executed.

However, in the present invention, the N-type layer for the N-channel type DMOS transistor may be formed. Namely, in view of the balance between the driving capability of the P-channel DMOS transistor and that of the N-channel type DMOS transistor, the P-type layer and the N-type layer may be formed for the respective DMOS transistors.

As described above, in the structure according to the invention, by forming the P-type layer 16 in the upper part of the N-type body layer 14 (interface of the channel layer below the gate electrode 18), the driving capability of the P-channel MOS transistor can be improved as compared with the conventional structure. In addition, by adjusting the dopant concentration of the P-type layer 16, the driving capability of the P-channel MOS transistor can be set equally to that of the N-channel type DMOS transistor. This removes necessity of applying a high voltage for improving the switching characteristic of the P-channel DMOS transistor.

Further, in the manufacturing method according to the invention, since the gate electrode 18 is formed after all the steps of ion-implantation (for the P-channel type DMOS transistor) have been completed, the P-type layer 16 can be formed which could not formed by the conventional manufacturing method (in which the body layer is formed by diffusion after the gate electrode has been formed).

The structure according to the invention, in which the N-type body layer 14 or P-type body layer (not shown) is formed only below the gate electrode 18, can reduce the junction capacitance more greatly than the conventional structure in which the heavily doped source layer is enveloped by the P-type body layer or N-type body layer.

The structure according to the invention, in which the P-type body layer or N-type body layer is formed by ion-implantation, can realize down-sizing as compared with the conventional structure.

Unlike the conventional manufacturing method, when the DMOS transistor is formed, the manufacturing method according to the invention does not require high temperatures heat treatment for forming the body layer after the gate electrode has been formed, and hence can include a step for down-sizing in the manufacturing process.

According to the present invention, by forming a thin p type impurity region in a channel layer in each of the conduction type of body controlling the driving capability in the N channel DMOS transistor, the driving capability of the P-channel type DMOS transistor which is inferior to that of the N-channel type DMOS transistor can be improved.

Further in the DMOS transistors, by forming impurity layer of each conduction type in each of the channel layers corresponding to the conduction type of the body layers, the driving capability of opposite conduction type of transistors formed on a substrate can be made uniform.

In the same conduction type of DMOS transistors, by forming impurity layer of conduction type in the channel layers of the body layers, the driving capability can be controlled.

Further the above method (not shown), since all of the impurity layers are formed prior to forming a gate electrode, the above structure of the P-channel DMOS transistor can be obtained.

Next, another method of the present invention will be explained. In the-embodiment, by forming an impurity region which has an opposite conduction type to that of the body layer, threshold voltage can be lowered and the driving capability can be improved.

Since the depth of SLP layer 9 and that of P type layer are made equal, by forming the SLP layer 9 on condition that compensate the P type layer, the step of forming step P type, layer 16 after forming N type body layer 14can be reduced. For example, by making a condition for forming the SLP by ion implanting as acceleration voltage 50KeV $2.5\times10^{12}/cm^2$, threshold voltage can be lowered appropriately without ion implanting for P type layer.

This method is also applicable not only P channel DMOS transistor but also to N channel DMOS transistor.

What is claimed is:

1. A semiconductor device comprising:
   a semiconductor layer having a first conduction type;
   source/drain layers having a second conduction type which is opposite to said first conduction type;
   a gate electrode formed on a channel layer located between the source/drain layers;
   a body layer having the first conduction type formed at least below the gate electrode; and
   a layer having the second conduction type formed in the channel layer between the entire upper part of the body layer having the first conduction type and the gate electrode, and separated from the semiconductor layer by the body layer.

2. A semiconductor device according to claim 1, wherein the body layer prevents contact between the layer having the second conduction type and the semiconductor layer.

3. A semiconductor device comprising:
- a semiconductor layer having a first conduction type;
- source/drain layers having a second conduction type which is opposite to the first conduction type;
- a gate electrode formed on a channel layer located between the source/drain layers;
- a layer having the second conduction type formed in the channel layer; and
- a body layer having the first conduction type formed at least below the gate electrode and below an entire lower surface of the layer having the second conduction type.

4. A semiconductor device according to claim 1, comprising:
- a gate electrode formed on a semiconductor layer having a first conduction type through a gate oxide film;
- a heavily-doped source layer having the second conduction type opposite to the first conduction type which is formed so as to be adjacent to the one end of said gate electrode;
- a heavily-doped drain layer having the second conduction type which is formed so as to be apart from the other end of the gate electrode;
- a lightly-doped drain layer having the second conduction type which is formed so as to surround said heavily-doped drain layer from below said gate electrode;
- a body layer having the first conduction type which is formed between said source layer below said gate electrode and said lightly-doped drain layer; and
- a layer having the second conduction type formed in an upper part of said body layer having the first conduction type.

5. A semiconductor device according to claim 1, wherein said lightly-doped drain layer having the second conduction type is shallow below said gate electrode and deep below said heavily-doped drain layer having the second conduction type.

6. A semiconductor device according to claim 1, wherein said channel is P channel.

7. A semiconductor device according to claim 1, wherein said body layer having the first conduction type formed is formed only below the gate electrode.

8. A semiconductor device according to claim 1, wherein said body layer is an impurity region formed by ion implantation.

* * * * *